(12) United States Patent  
Mizuno (10) Patent No.: US 7,943,533 B2  
(45) Date of Patent: May 17, 2011

(54) METHOD FOR SURFACE MODIFICATION (75) Inventor: Takeshi Mizuno, Tokyo (JP)

(73) Assignee: Sony Corporation, Tokyo (JP)

( * ) Notice: Subject to any disclaimer, the term of this patent is extended or adjusted under 35 U.S.C. 154(b) by 873 days.

(21) Appl. No.: 11/764,996

(22) Filed: Jun. 19, 2007

(65) Prior Publication Data  
US 2008/0132088 A1 Jun. 5, 2008

(30) Foreign Application Priority Data  
Jun. 21, 2006 (JP) ................. P2006-171599

(51) Int. Cl.  
*H01L 21/00* (2006.01)
(52) U.S. Cl. ......... 438/795; 438/166; 438/487; 438/662
(58) Field of Classification Search .................. 438/166, 438/795, 486, 487, 662  
See application file for complete search history.

(56) References Cited

U.S. PATENT DOCUMENTS

| | | | | |
|---|---|---|---|---|
| 5,760,411 A | * | 6/1998 | Kawakubo | 250/548 |
| 5,847,812 A | * | 12/1998 | Ooki et al. | 355/67 |
| 6,809,291 B1 | * | 10/2004 | Neil et al. | 219/121.76 |
| 6,905,920 B2 | * | 6/2005 | Higashi et al. | 438/197 |
| 7,615,424 B2 | * | 11/2009 | Tanaka et al. | 438/166 |
| 2007/0079750 A1 | * | 4/2007 | Miguez et al. | 117/68 |

FOREIGN PATENT DOCUMENTS  
GB 2 108 761 * 11/1982  
JP 2003-025085 1/2003

OTHER PUBLICATIONS

Kenj Orita et al.; High-Extraction-Efficiency Blue Light-Emitting Diode Using Extended-Pitch Photonic Crystal; Japanese Journal of Applied Physics; vol. 43, No. 8B, 2004, pp. 5809-5813.

* cited by examiner

*Primary Examiner* — Thinh T Nguyen  
(74) *Attorney, Agent, or Firm* — SNR Denton US LLP (57) ABSTRACT

A method for surface modification is disclosed. The method includes the step of irradiating a material with ultrashort pulse laser light to form a modified region including an amorphous region and/or a strain region on a surface of the material.

18 Claims, 8 Drawing Sheets

METHOD FOR SURFACE MODIFICATION

CROSS REFERENCES TO RELATED APPLICATIONS

The present invention contains subject matter related to Japanese Patent Application JP 2006-171599 filed in the Japanese Patent Office on Jun. 21, 2006, the entire contents of which being incorporated herein by reference.

BACKGROUND OF THE INVENTION

1. Field of the Invention

The present invention relates to a method for surface modification by which a crystalline state of a surface of a material is modified such as a semiconductor material.

2. Description of the Related Art

GaN-LEDs (light-emitting diodes) have been increasingly used in fabrication of backlights, illuminating devices, or the like of liquid crystal panels. Accordingly, technologies for outputting GaN-LEDs with a high efficiency have been increasingly developed.

Outputting GaN-LEDs with a high efficiency may mainly involve two methods, one of which is a method of increasing internal quantum efficiency and the other of which is a method of increasing extraction efficiency of light actually emitted. With regard to the former method, internal quantum efficiency has been increased to a certain extent by reducing a defect density in a GaN crystal; whereas the latter method, extraction efficiency of light has been increased by improving a structure of a light-emitting edge or combining a GaN crystal with a resin lens (also serving as a sealing).

Figure 1:
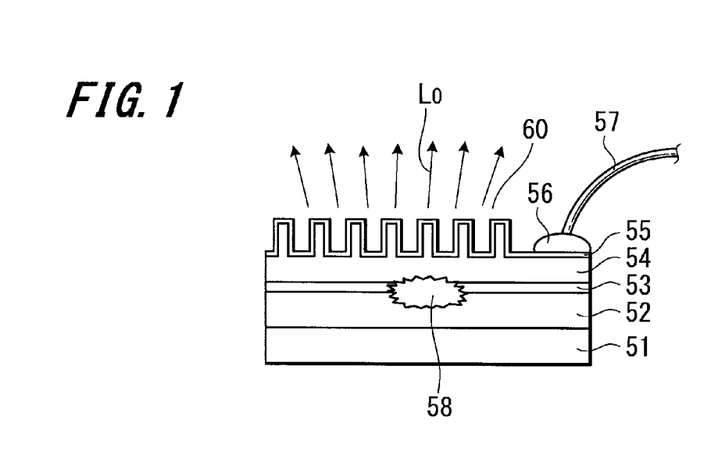
FIG. 1 is a schematic sectional view of an example of a semiconductor light-emitting element.

In improvement of a structure of a light-emitting edge, K. Orita et al., "High-Extra-Efficiency Blue Light-Emitting Diode Using Extended-Pitch Photonic Crystal", Japanese Journal of Applied Physics, Vol. 43, No. 8B, (2004), pp. 5809-5813 has reported a case where a two-dimensional periodic structure (a photonic crystal in a broad sense) is provided on an entire or portion of a light-emitting edge of LED to increase extraction efficiency of light, for example. According to the aforementioned Japanese Journal of Applied Physics, a two-dimensional structure is formed on one surface of a semiconductor light-emitting element as shown in a schematic sectional view of FIG. 1. An n-type GaN clad layer 52, an InGaN active layer 53, and a p-type GaN clad layer 54 are formed on a substrate 51 formed of sapphire, and a two-dimensional structure 60 is formed only on the p-type GaN clad layer 54 by a lithographic technology. A transparent conductive layer 55 is formed on the two-dimensional structure 60 and is connected to an electrode 56 and a wiring 57. Extraction power having such a configuration is about 1.5 times that of a configuration in which a two-dimensional structure is not provided.

When such a periodic structure is formed in an LED, the structure may be formed in a portion extremely close to a light source and may be formed in any shape. Therefore, emission of light from an active layer may be more efficiently controlled, and high extraction efficiency may be realized. However, when the periodic structure is formed by a typical semiconductor lithographic technology currently used, a simple method with which a high cost performance is achieved may be desired, since a high-precision photomask may be necessary and formation steps are complicated, for example.

In contrast, there has been proposed a more simple method of forming various structures including a periodic structure by laser drawing or interference exposure. In this method, a photomask may not have to be used and an extremely simple processing step may be employed. However, a laser processing process of the related art including melting may involve such drawbacks as a low shape accuracy and debris.

In recent years, a processing process using a femtosecond laser has been attracted attention as a laser process and shape processing may be expected to be performed with higher accuracy. In the processing process using a femtosecond laser, a bond may be directly broken by a multiphoton absorption process, and the absorption process is finished before thermal vibration of atoms or molecules starts, thereby achieving a non-thermal processing process. In this case, accuracy degradation in thermal processing may be eliminated, and debris may also be treated in a relatively simple cleaning process in which no melting marks are formed. Thus, as Japanese Unexamined Patent Application Publication No. 2003-25085, for example, discloses that not only may more accurate processed shapes be expected, but all the processing steps may also be simplified.

SUMMARY OF THE INVENTION

However, a structure is formed using glass or a photocurable resin in almost all cases as disclosed in the aforementioned Japanese Unexamined Patent Application Publication No. 2003-25085 and Japanese Journal of Applied Physics, and no case has been reported where a structure is actually formed on a semiconductor material such as GaN or GaAs. By contrast, an effect on a more practical material, in particular, specific effects on a semiconductor material that is processed using an ultrashort pulse laser such as a femtosecond laser may have to be clarified.

Specifically, there have been little on examining an effect on forming a periodic structure, for example, examining an adverse effect on an ablation portion and the periphery of the portion when forming a two-dimensional periodic structure on a GaN substrate or the like in order to the luminous efficiency of the aforementioned light-emitting element or the like and hence, few proposals have been attempted on developing more practical processing methods by the analysis of the effect. Not only is an irregular structure accurately formed, but a fine periodic structure in which regions having different optical properties are periodically arranged may also be accurately formed. This may provide an effect of improving light-emitting efficiency of the aforementioned semiconductor light-emitting element or the like. Accordingly, a technology to reliably and accurately form such a periodic structure may be desired.

Attempts have been made to modify a surface of various materials such as a semiconductor material using an ultrashort pulse laser such as a femtosecond laser.

According to an embodiment of the present invention, there is provided a method for surface modification, including the step of irradiating a material with ultrashort pulse laser light to form a modified region including an amorphous region and/or a strain region on a surface of the material.

According to another embodiment of the present invention, there is provided a method for surface modification as described above, where the ultrashort pulse laser light has a pulse width of 1 femtosecond to 10 picoseconds.

According to a further embodiment of the present invention, there is provided a method for surface modification as described above, further including the step of performing interference exposure for the material using a diffractive element to periodically form the modified region on the surface of the material.

As described above, a method for surface modification according to an embodiment of the present invention includes the step of irradiating a material with ultrashort pulse laser light to form a modified region including an amorphous region and/or a strain region on a surface of the material.

According to embodiments of the present invention, when a surface of a material is irradiated with ultrashort pulse laser light, a modified region is formed including an amorphous region and a strain region in this order in a depth direction of the material, as described later. In particular, an excellent modified region may be formed when the ultrashort pulse laser light has a pulse width of 1 femtosecond to 10 picoseconds.

Processing of a material includes irregular processing in which an irregular structure is formed on a surface by ablation, for example, and modification in which only a crystalline state is modified without forming an irregular structure on a surface. Specifically, a material having a surface modified according to an embodiment of the present invention includes a material having a surface with irregular structure and a material having a surface without irregular structure.

Furthermore, a modified region including an amorphous region and a strain region may be periodically formed on a surface of a material by performing interference exposure for the material using a transmission-type diffractive element, for example.

Therefore, according to an embodiment of the present invention, a modified region including an amorphous region and/or a strain region may be reliably and accurately formed on a surface of a material.

According to an embodiment of the present invention, a modified region including an amorphous region and/or a strain region may be formed on a material such as a semiconductor material.

DESCRIPTION OF THE PREFERRED EMBODIMENTS

A best mode for carrying out the present invention will be described below; however, the present invention is not limited to the following examples.

Figure 2:
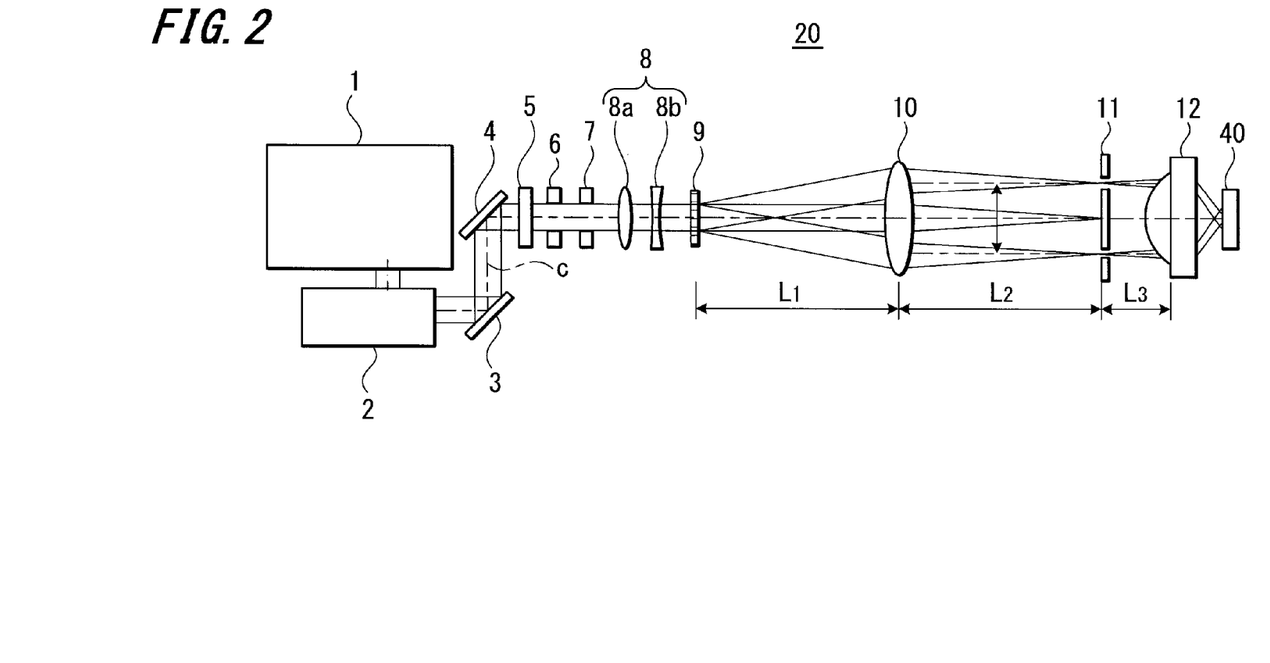
FIG. 2 is a schematic configuration diagram of an example of a laser apparatus used in a method for surface modification according to an embodiment of the present invention.

FIG. 2 is a schematic configuration diagram of an example of a laser apparatus in which a method for surface modification according to an embodiment of the present invention may be carried out. FIG. 2 shows a case where interference exposure is performed using four beams of short pulse laser light. However, an embodiment of the present invention may be performed not only by interference exposure but also by sweep irradiation, as described later. A three-dimensional structure may be formed by performing interference exposure using five beams including a beam of zeroth-order light in addition to the four beams. As shown in FIG. 2, the laser apparatus 20 has a pulse laser light source 1, a wavelength conversion unit 2, mirrors 3 and 4, an ND (Neutral Density) filter 5, an iris 6, a shutter 7, an afocal optical system 8 having lenses 8*a* and 8*b*, a diffractive element 9 including a diffractive beam splitter (DBS), a collimator lens 10, a light selecting element 11, and a capacitor lens 12.

The laser apparatus 20 may be configured to include Mai Tai manufactured by Spectra-Physics, Inc. (trade name, Ti:sapphire laser, central wavelength: 800 nm, pulse width: about 100 fs, repetition frequency: 80 MHz) as an oscillator for the pulse laser light source 1, and Spitfire manufactured by Spectra-Physics, Inc. (trade name, central wavelength: 800 nm, pulse width: about 100 fs, repetition frequency: 1 kHz) as a regenerative amplifier. The laser apparatus 20 may also be configured so that light emitted from the regenerative amplifier is incident to the wavelength conversion unit 2, for example, a second harmonics generator to generate output light at a wavelength of 400 nm in the generator, for example, and the emitted light is entered into an interference exposure optical system. In this case, a highest output pulse energy from the second harmonics generator is approximately 350 μJ.

Figure 3:
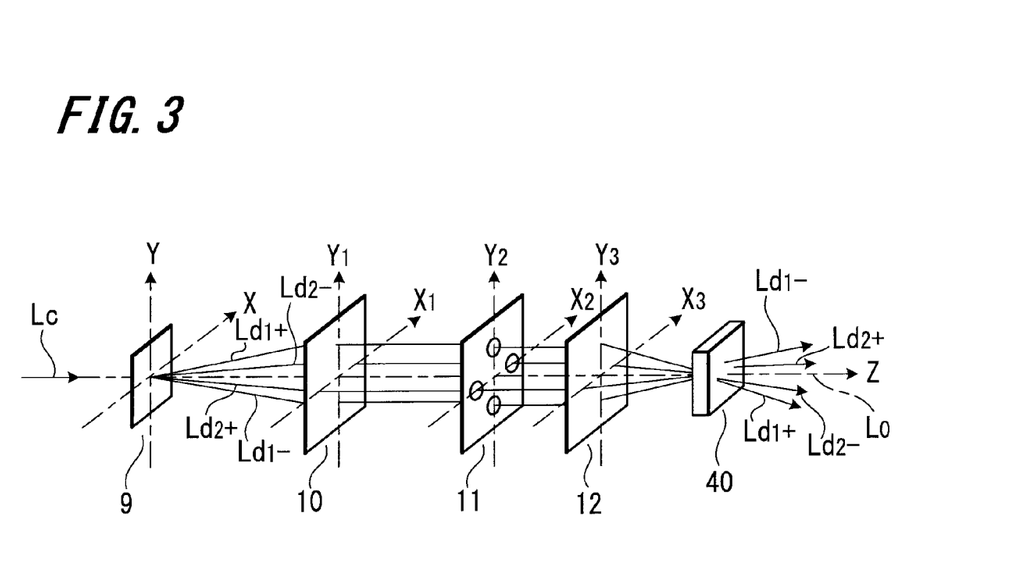
FIG. 3 is a schematic perspective view for illustrating an example of a mode in which laser light is diffracted in the laser apparatus shown in FIG. 2.

In the laser apparatus 20 having the above-described configuration, collimate light emitted from the light source system is entered into the diffractive element 9 such as DBS through the ND filter 5, the iris 6, the shutter 7, and the afocal optical system 8 having a magnification of 0.88, for example. DBS is a transmission-type beam splitter utilizing diffraction of light and generates two pairs of plus and minus first-order light in addition to zeroth-order light. FIG. 3 is a schematic perspective view for illustrating diffracted light in this case. In FIG. 3, a Z axis indicates a direction of an optical axis, and X and Y axes indicate directions perpendicular to each other on a plane perpendicular to the optical axis (X, X1, X2, and X3 for the X axis and Y, Y1, Y2, and Y3 for the Y axis). In this example, two pairs of plus and minus first-order light LD1+, LD1−, LD2+, and LD2− diffracted in each of X-axis and Y-axis directions are generated in the diffractive element 9 including DBS. Specifically, four beams in total of first-order diffracted light and a beam of zeroth-order light are generated in the diffractive element 9. Here, diffraction efficiency of each of zeroth-order light and two pairs of plus and minus first-order light may be 12.8% in designing the diffractive element 9.

Figure 4:
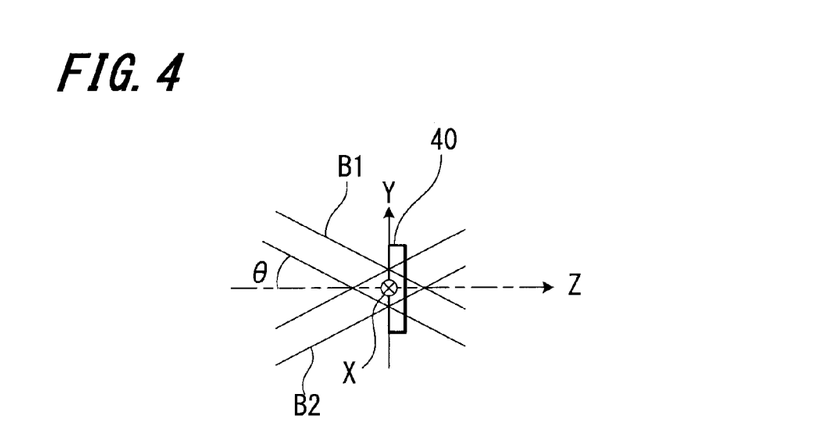
FIG. 4 is a view illustrating an angle of incidence of diffracted light.

The five beams generated by the diffractive element 9 are entered into the collimator lens 10 having a focal length of 200 mm, for example. The collimator lens 10 is placed so that optical axes of the beams are parallel to each other via the collimator lens 10, thereby converging the beams in the diffractive element 9. Specifically, a distance between the diffractive element 9 and the collimator lens 10 is 200 mm, having the same distance as a focal length of the collimator lens 10. Thereafter, the beams are entered into the light selecting element 11 placed at a position of 200 mm from the collimator lens 10, and the beam of zeroth-order light is removed and only the four beams of first-order light are extracted in the light selecting element 11. The four beams of first-order diffracted light are entered into the capacitor lens 12 having a focal length of 12 mm, for example. A material 40 is placed at a position where the beams intersect with each other and processed by interference exposure. Here, relative positions of the light selecting element 11 and the capacitor lens 12 are selected so that the beams are parallel to each other when interference exposure is performed. FIG. 4 schematically shows a state in which beams intersect with each other in a Y-Z plane, where each of beams B1 and B2 of diffracted light is incident at an angle of incidence θ with respect to an optical axis of the entire optical system (original optical axis which corresponds to the Z axis in FIG. 3). Each beam of first-order diffracted light on an X-Z plane is also incident at the same angle of incidence, although this is not shown in the figure.

Figure 5A:
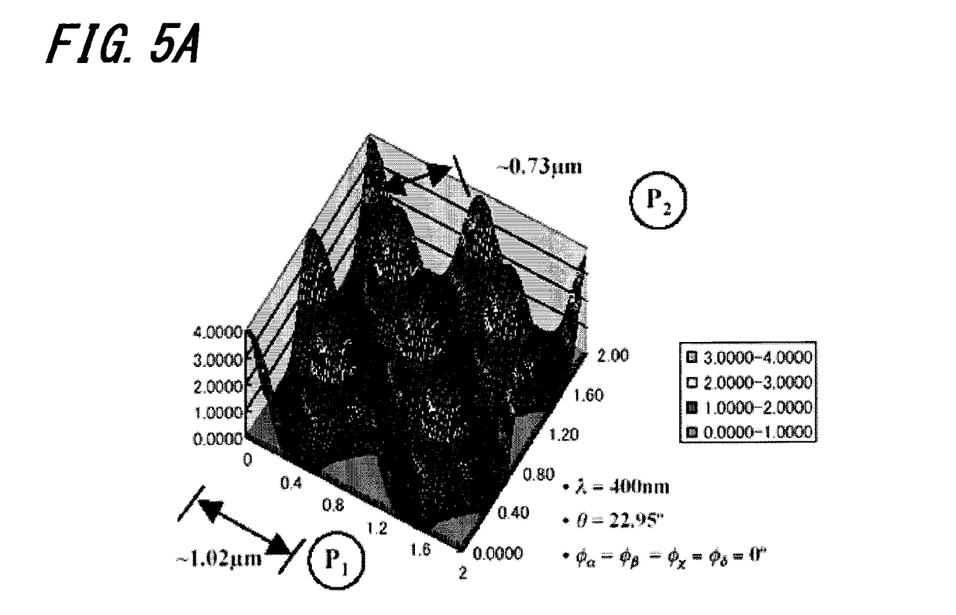
FIGS. 5A and 5B are views showing results of analyzing an intensity of diffracted light when four-beam interference exposure is performed in an embodiment of the present invention.
Figure 5B:
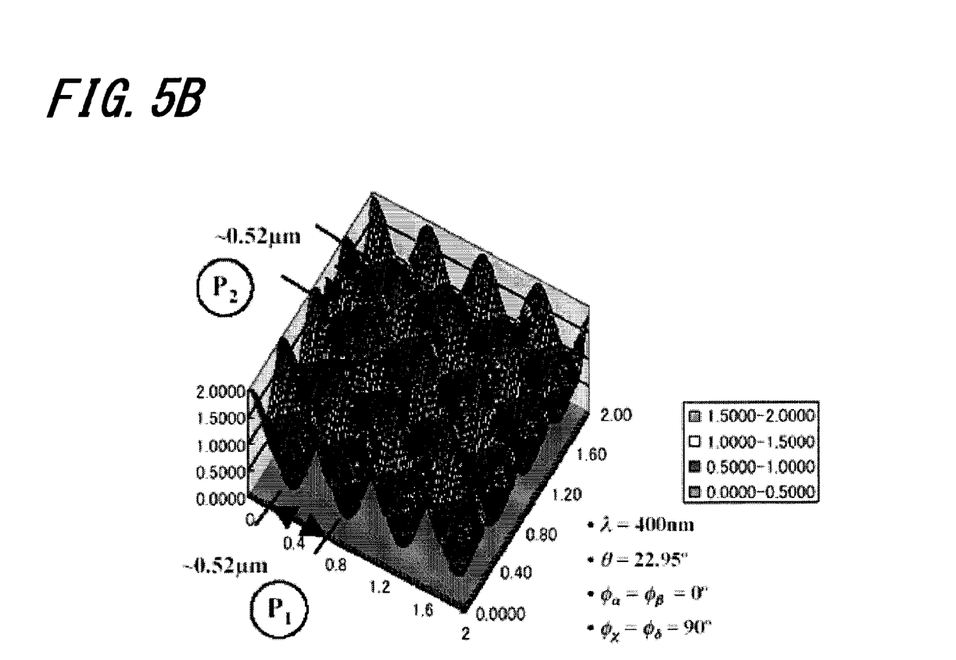

An interference intensity distribution obtained in the above-described optical system may be described by a general equation of multiple beam interference and may be represented by the following equation 1:

$$I = \cos^2[\kappa \cdot \sin\theta \cdot x + (\phi_\alpha - \phi_\beta)/2] + \cos^2[\kappa \cdot \sin\theta \cdot y + (\phi_\chi - \phi_\delta)/2] + 2\cos[\{(\phi_\alpha + \phi_\beta) - (\phi_\chi + \phi_\delta)\}/2] \times \cos[\kappa \cdot \sin\theta \cdot x + (\phi_\alpha - \phi_\beta)/2] \times \cos[\kappa \cdot \sin\theta \cdot y + (\phi_\chi - \phi_\delta)/2] \quad (1)$$

where κ is a wave number (κ=2π/λ, λ: wavelength), θ is a value half of an angle at which beams of first-order diffracted light intersect with each other, and φα, φβ, φχ, and φδ represent a phase state of each beam on a surface of the capacitor lens 12. FIGS. 5A and 5B show an example of analysis results based on values derived from the equation 1. As is clear from the equation 1, the interference intensity distribution depends only on an angle of incidence (θ) of each beam, a phase state of the beam φα, φβ, φχ, or φδ, and a wavelength. FIG. 5A shows a case where φα=φβ=φχ=φδ=0°, and FIG. 5B shows a case where φα=φβ=0° and φχ=φδ=90°. In each case, a wavelength λ is 400 nm and θ is 22.95°. In the example shown in FIG. 5A, periods are provided in two directions that form an angle of 45°, where a shorter period P2 is about 0.73 μm and a longer period P1 is about 1.02 μm. In the example shown in FIG. 5B, periods are isotropic, where the periods (P1=P2) are about 0.52 μm each. In the following embodiment, interference exposure is performed corresponding to the analysis example shown in FIG. 5A.

Figure 6:
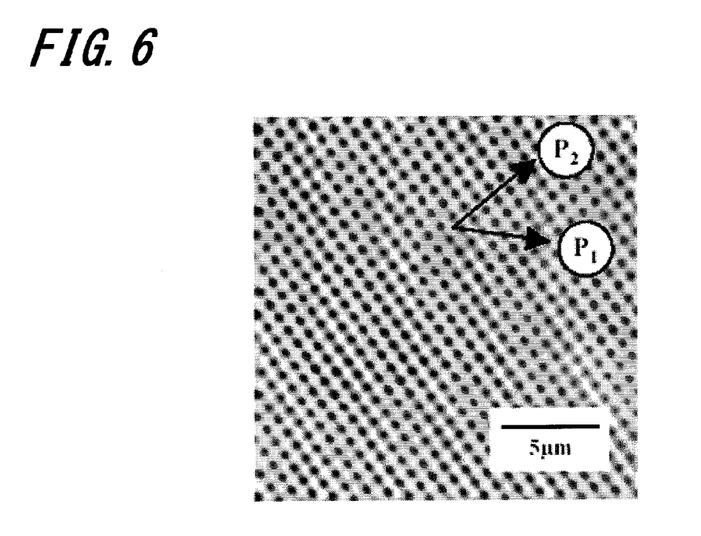
FIG. 6 is an observation photograph using an electron microscope of a surface of a material for which four-beam interference exposure is performed under conditions determined by analysis results are shown in FIG. 5A.
Figure 7A:
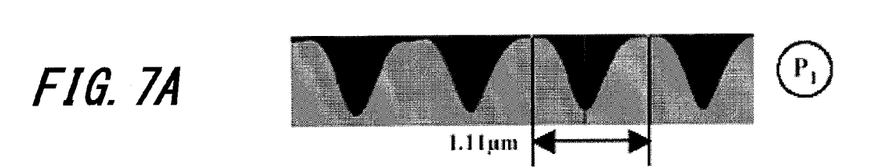
FIGS. 7A and 7B are observation photographs using an electron microscope of a section of a material for which four-beam interference exposure is performed under conditions determined by analysis results are shown in FIG. 5A.
Figure 7B:
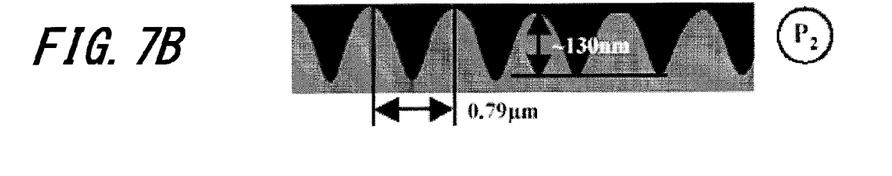

FIG. 6 is an observation photograph in which a surface of a material formed by interference exposure using the laser apparatus of FIG. 2 under the conditions shown in FIG. 5A is observed using an atomic force microscope (AFM). In FIG. 6, directions corresponding to the periods P1 and P2 in FIG. 5A are indicated by arrows P1 and P2, respectively. FIG. 7A shows a section along the period P1, and FIG. 7B shows a section along the period P2. In this example, a GaN substrate having a surface of a crystal orientation of <0002> is used as a material. The material is processed under conditions in which a laser pulse width is about 100 fs, an energy per pulse of each beam of first-order diffracted light is about 4.6 μJ, and a number of times of interference pulse exposure is 3. A processing time is 3 ms. As clear from FIGS. 6, 7A, and 7B, a two-dimensional periodic structure is formed on a surface of the material (GaN substrate) by ablation in this example. The structure has an average processing size of about 30 μmφ and an average depth of about 130 nm under the above processing conditions. As clear from the figures, the formed structure has a period of 0.79 μm and a period of 1.11 μm, and this becomes highly congruent with the analysis results in FIG. 5A. In addition, the structure has a shape of a sine wave corresponding to the interference intensity distribution and has an appropriate processing shape not affected by melting or the like. GaN has an energy band gap of about 3.4 eV to 3.45 eV, and light may not be absorbed at a wavelength of 360 nm or more.

Irradiation with a femtosecond laser may slightly increase a temperature in an irradiated portion. However, a melting mark or the like is not observed as described above, and the increase in the temperature may not cause melting. S. Nakamura, S. Pearton, and G. Fasol, "The Blue Laser Diode", Springer-Verlag, Berlin, 1997, 2nd edition, p. 42 has reported that GaN has a melting point of 1,700° C. or higher. Accordingly, the processing process in this example may be a non-linear absorption process and a two-photon absorption process.

The material fails to be processed in the laser apparatus 20 shown in FIG. 2 without a wavelength conversion unit such as a second harmonics generator at a wavelength of 800 nm, that is, by a four-photon absorption process. Since an energy for induction differs between two-photon absorption and four-photon absorption by four digits, so that the four-photon absorption process may not actually be used for energy irradiation. In contrast, when the material is processed using a third harmonics generator at a wavelength of 266 nm, the material may be processed at a lower energy. The second harmonics generator or the third harmonics generator may be appropriately selected depending on efficiency obtained in the generation of each harmonics.

An ultrashort pulse laser used in an embodiment of the present invention preferably has a wavelength in a range in which exposure may be performed at least in a two-photon absorption process or a one-photon absorption process depending on an absorption edge of a material. Accordingly, an additional lens may not be added to an optical system for obtaining an irradiation energy, and thus a number of optical portions may be reduced. Accordingly, an optical system may be formed more stably and easily, and a laser apparatus used in a method according to an embodiment of the present invention may be simply configured.

As clear from the above results, a periodic structure may be accurately formed on a surface of a semiconductor material such as GaN in this case utilizing a non-linear absorption process by multiple beam interference exposure using femtosecond laser light.

Next, results of examining a crystalline state near a surface of a periodic structure formed on the semiconductor material will be described as a result of ablation by pulse laser irradiation.

Figure 8:
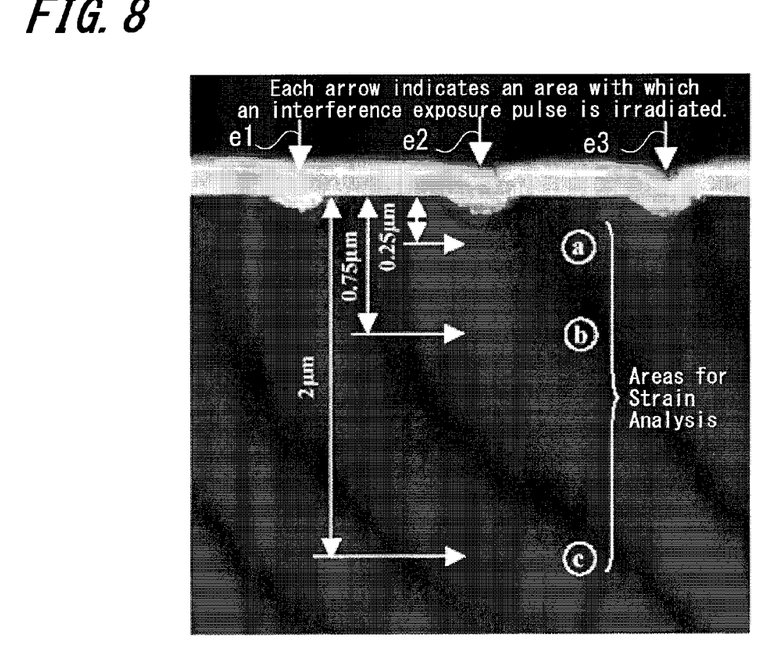
FIG. 8 is an observation photograph using an electron microscope of a section of a material for which four-beam interference exposure is performed under conditions determined by analysis results are shown in FIG. 5A.
Figure 9:
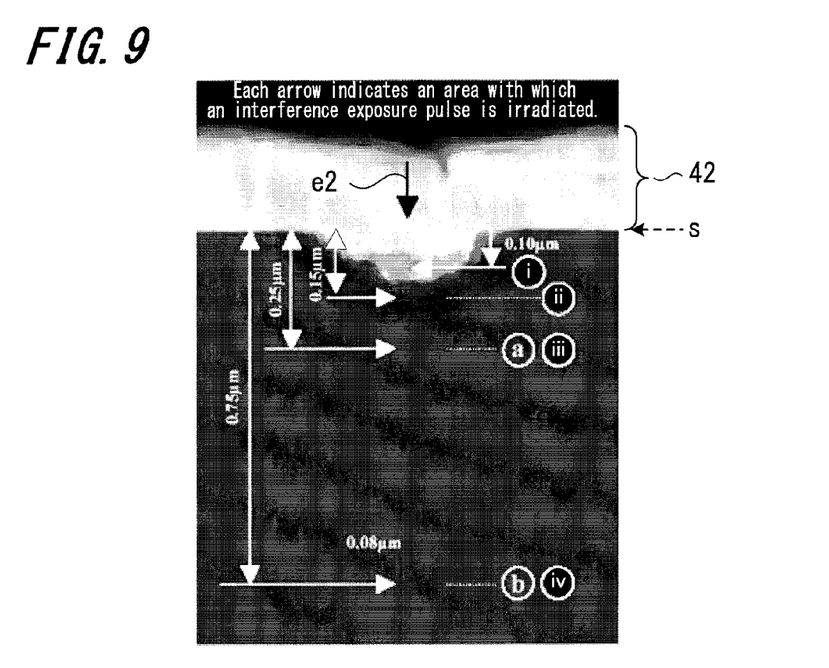
FIG. 9 is an enlarged view of the observation photograph shown in FIG. 8.

FIG. 8 is an observation photograph in which a section of a periodic structure formed in the example shown in FIGS. 6 and 7 is observed using a transmission electron microscope (TEM). In this case, the transmission electron microscope has a spatial resolution of 10 nm. Portions indicated by arrows e1, e2, and e3 in FIG. 8 are irradiated with an interference exposure pulse. FIG. 9 shows an enlarged observation photograph of a portion near the portion indicated by the arrow e2 in FIG. 8. Positions each having a depth of 0.25 μm, 0.75 μm, or 2 μm from a surface in FIG. 8 are indicated by reference symbols a, b, and c, respectively. Similarly, positions each having a depth of 0.10 μm, 0.15 μm, 0.25 μm, or 0.75 μm from a surface in FIG. 9 are indicated by reference symbols i, ii, iii (=a) and iv (=b), respectively.

The material formed of GaN is processed by two-beam interference exposure in order to facilitate an observation of a section, so that a diffraction lattice-shaped one-dimensional periodic structure is formed having a period of about 1 μm. The material is processed under conditions in which a pulse width is about 340 fs, an energy per pulse is about 5.2 μJ per beam (processing threshold energy: about 4.8 μJ), and a number of times of interference pulse exposure is 10. A structure actually formed has a processing depth of about 50 nm. A surface of the material shown in the figure is covered with a carbon film 42 in order to prevent damage by FIB (focused ion beam) processing. In FIG. 9, the surface of the material is indicated by an arrow S.

As clear from FIGS. 8 and 9, in a region immediately under a portion in which ablation occurs by interference exposure, two portions are formed surrounding the ablation portion, which respectively have contrasts different from that of a portion not affected by ablation. These two zonal portions have a width of about 50 nm each, and depths of thickness centers of these portions are respectively about 100 nm (0.1 μm) and about 150 nm (0.15 μm) from the surface of the material formed of a GaN substrate. In FIG. 9, reference symbols i and ii indicate corresponding portions.

Further, at a depth of 250 nm (0.25 μm) deeper than the thickness centers (indicated by a reference symbol iii in FIG. 9), a difference in contrasts or the like is not particularly observed, and a crystal defect may not occur by damaging or the like during laser irradiation or ablation in a portion at that depth and the immediate periphery thereof.

These two zonal regions immediately under the ablation portion indicate that a state of emission of secondary electrons during observation significantly varies. Accordingly, some change in a structure or state may occur. There may be mainly two origins of such change of state.

One origin is transition to an amorphous state or a state close to the amorphous state, and another origin is transition to a state in which a lattice space remains almost unchanged but a small strain occurs in the lattice space. In a portion lower than these portions in which contrasts are changed, a contrast is not particularly changed during TEM observation, but a small strain may occur.

Accordingly, a lattice state is first examined based on observation of an electron diffraction image in order to examine a state of these portions. The results are shown in FIGS. 10A to 10D. FIGS. 10A to 10D show diffraction images of positions indicated by reference symbols i, ii, iii, and iv in FIG. 9, respectively. As clear from FIG. 10A, in a portion immediately under an ablation portion where a contrast is changed (a portion at a depth of 100 nm from the substrate surface, specifically, a portion indicated by a reference symbol i in FIG. 9), a clear amorphous pattern is observed and the portion is completely amorphized.

Figure 10A:
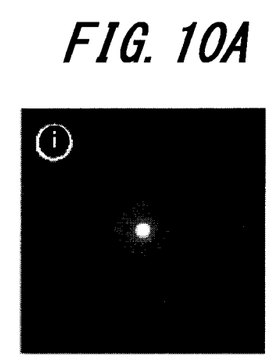
FIGS. 10A to 10D are views showing an electron beam diffraction pattern of a material for which four-beam interference exposure is performed under conditions determined by analysis results are shown in FIG. 5A.
Figure 10B:
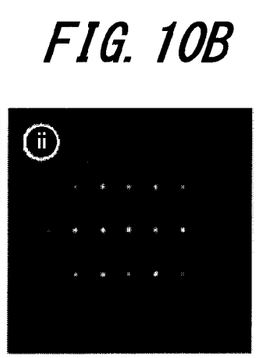
Figure 10C:
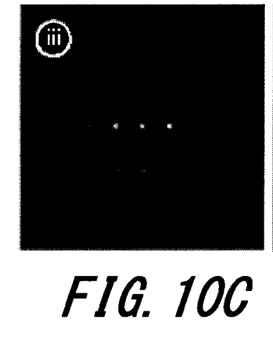
Figure 10D:
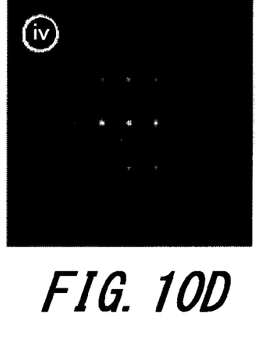

On the other hand, as clear from FIG. 10B, in another portion where a contrast is changed outside (under) the above portion (a portion at a depth of 150 nm, specifically, a portion indicated by a reference symbol ii), a diffraction image based on a crystal orientation is observed and a lattice state is not particularly changed. As clear from FIGS. 10C and 10D, in a portion at a depth of 250 nm (a portion indicated by a reference symbol iii in FIG. 9) and a portion at a depth of 750 nm (a portion indicated by a reference symbol iv) which are lower than the above portions, a diffraction image based on a crystal orientation is observed and a lattice state is not particularly changed.

Accordingly, amorphization may be induced only in a region of several tens nm immediately around an ablation portion at a depth of about 50 nm, and a lattice state is not drastically changed in other portions.

Figure 11:
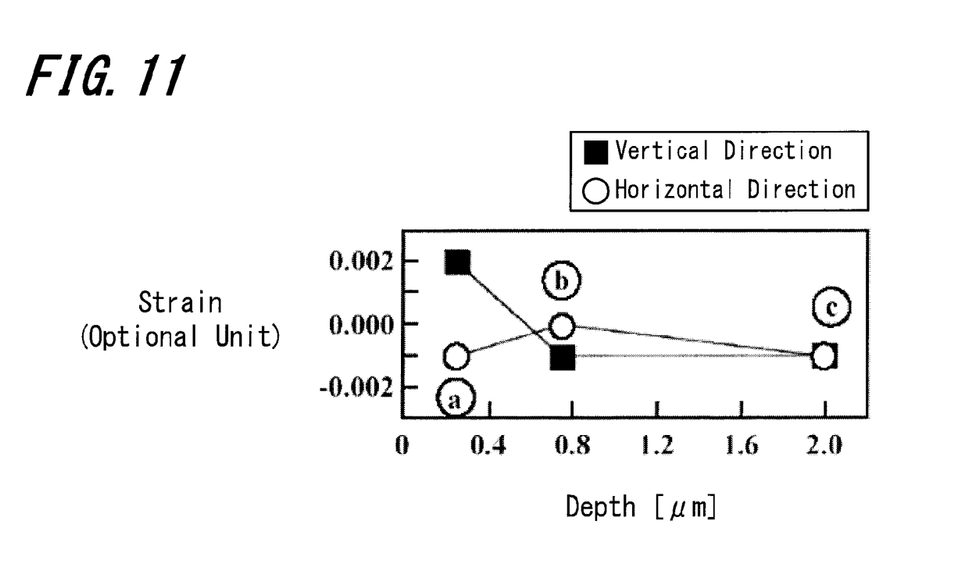
FIG. 11 is a view showing results of measuring a strain of a material for which four-beam interference exposure is performed under conditions determined by analysis results are shown in FIG. 5A.

Next, strain analysis is conducted to examine whether or not a lattice strain occurs. Here, strain analysis is conducted using convergent electron diffraction. A spatial resolution in this case is 10 nm. For convenience of measurement, this measurement is conducted mainly for a portion at a depth of 250 nm (a portion indicated by a reference symbol a in FIG. 8), a portion at a depth of 750 nm (a portion indicated by a reference symbol b in FIG. 8), and a portion at a depth of 2,000 nm (a portion indicated by a reference symbol b in FIG. 8), where contrasts are not changed before and after ablation. The results are shown in FIG. 11. In FIG. 11, (+) along a vertical axis indicates a strain in a tensile direction, and (−) along the vertical axis indicates a strain in a compression direction. As clear from FIG. 11, a tensile strain occurs in a portion at a depth of 250 nm particularly in a vertical direction, and a particularly strong strain does not occur in a portion deeper than that portion. A variation of about ±0.001 may be within the margin of error. Accordingly, it is presumed that a considerably strong strain occurs even in a portion at a depth of 150 nm. This region may be in a weak amorphous state depending on irradiation energy.

H. Y. Peng, M. D. McCluskey, Y. M. Gupta, M. Kneissl, and N. M. Johnson, "Band Gap Shift of GaN under Uniaxial Strain Compression", Materials Research Society Symposium Proceedings, 693 (2002) I11.49.1 has reported that a band gap is shifted in such a strain portion as described above. For example, when a stress of 13.7 Gpa is applied to an Mg-doped GaN substrate in a c-axis direction of the substrate, a band gap of the Mg-doped GaN substrate is shifted at about 0.3 eV. This implies that a refractive index differs depending on the presence or absence of a strain when observed at the same wavelength. Specifically, the strain region may form a refractive index modulation region.

In contrast, such a strain region may be relaxed by annealing a material after ablation.

Figure 12A:
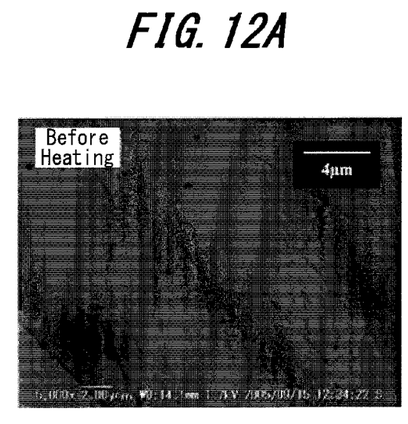
FIGS. 12A and 12B are observation photographs of a surface of a material of a method for surface modification according to an embodiment of the present invention before and after annealing, respectively.
Figure 12B:
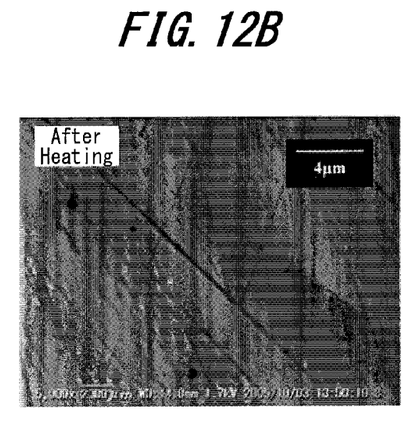
Figure 13A:
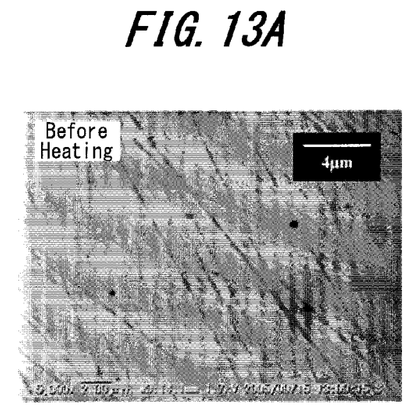
FIGS. 13A and 13B are observation photographs of a surface of a material of a method for surface modification according to an embodiment of the present invention before and after annealing, respectively.
Figure 13B:
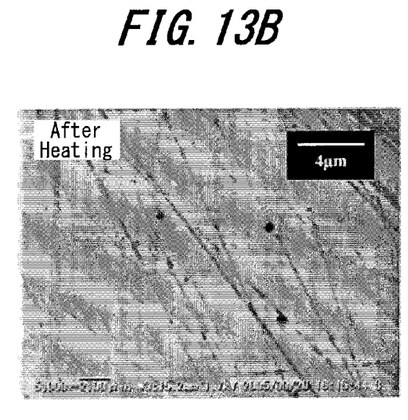

In this context, a change in a surface state when annealing a material after pulse irradiation is observed using a scanning electron microscope (SEM). FIGS. 12 and 13 show photographs of the observation. In the example, two-photon interference exposure is performed for the material at an energy slightly lower than (about 90 to 95% of) an ablation threshold energy to form a one-dimensional periodic structure. Specifically, in this case, a strained region is periodically formed on a surface of the material by a two-photon absorption process by irradiation with a femtosecond laser. Accordingly, a periodic refractive index distribution structure is formed on the surface of the material. Specifically, in this case, the surface may not be processed, and a region near the surface at a depth of about 100 nm or smaller does not have a completely amorphous region and is nearly dominated by a strain region. The refractive index distribution structure including a periodic strain region is formed under conditions in which an energy per pulse is about 7.0 μJ (processing threshold energy: about 7.4 μJ), a pulse width is about 340 fs, and a number of times of interference pulse exposure is 10.

That is, when a surface is modified at an energy per pulse equal to or lower than a processing threshold energy in this manner, the surface may be modified without forming an irregular structure by ablation on the surface, and a strain region is formed.

FIGS. 12A and 12B show SEM observation photographs of the material having a strain region formed before and after annealing at 150° C. for 12 hours, respectively. Similarly, FIGS. 13A and 13B show SEM observation photographs of the material before and after annealing at 250° C. for two hours, respectively. When the material is annealed at 150° C. for 12 hours, a contrast of the periodic structure remains almost unchanged before and after annealing, as shown in FIGS. 12A and 12B. In contrast, when the material is annealed at 250° C. for two hours, the contrast is obviously reduced. Accordingly, a strain is relaxed and the strain portion is recovered in a stable lattice state inherent to a GaN crystal when the material is annealed at 250° C. for two hours. Thus, a strain may be sufficiently relaxed under appropriate annealing conditions found, even in a portion in which a relatively weak strain occurs other than an amorphous region and a strong strain portion immediately under an ablation portion as in the aforementioned example described with reference to FIGS. 8 and 9 (a portion at a depth of 250 nm which is indicated by a symbol iii (=a) in FIG. 9). That is, as clear from the above results, a strain region may be periodically formed by irradiating a material, in particular, a semiconductor material such as GaN with an ultrashort pulse laser at an energy equal to or lower than an ablation threshold, and a strain in the strain region may be relaxed by performing appropriate annealing.

The demonstrates that, when a surface of a material, for example, a semiconductor material is irradiated with an ultrashort pulse laser to cause ablation, an amorphous region and a strain region are formed immediately under an ablation portion in this order in a depth direction.

A strain in a strain region formed by irradiation with an ultrashort pulse laser may be relaxed by annealing. Accordingly, when any region on a material is irradiated with an ultrashort pulse laser, an amorphous region and a strain region may be formed, or only an amorphous region may be formed, or only a strain region may be formed under irradiation conditions appropriately selected. Alternatively, only a strain region may be formed by forming an amorphous region and the strain region and removing only a portion in which the amorphous region is formed by chemical etching or physical etching, for example, polishing.

When a stable change of a refractive index may not be obtained in a strain region, the strain region is preferably relaxed by annealing, for example, to form only an amorphous region. In a light-emitting element, only an amorphous region is formed in this manner, so that an effect on a light-emitting region, that is, a decrease in light-emitting efficiency may be minimized.

Figure 14A:
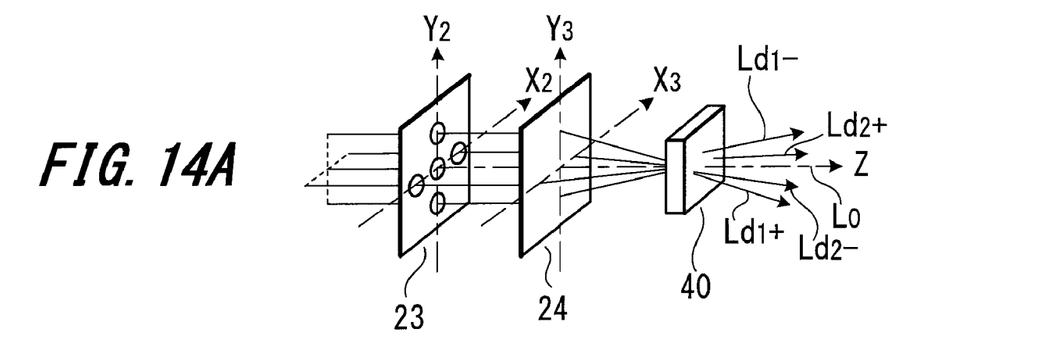
FIG. 14A is a schematic perspective view for illustrating an example of a mode in which laser light is diffracted in the laser apparatus shown in FIG. 2.

In each of the aforementioned examples, a two-dimensional or one-dimensional periodic structure is formed by performing interference exposure with four beams of plus and minus first-order light without a beam of zeroth-order light of ultrashort pulse laser light. However, as schematically shown in FIG. 14A, a three-dimensional periodic structure may be formed by interference exposure with five beams including four beams of plus and minus first-order diffracted light Ld1+, Ld1−, Ld2+, and Ld2− and a beam of zeroth-order light L0. In this case, plus and minus first-order diffracted light and zeroth-order light are caused to pass through a light selecting element 23, and five-beam interference exposure is performed for a material 40 through a capacitor lens 24.

Figure 14B:
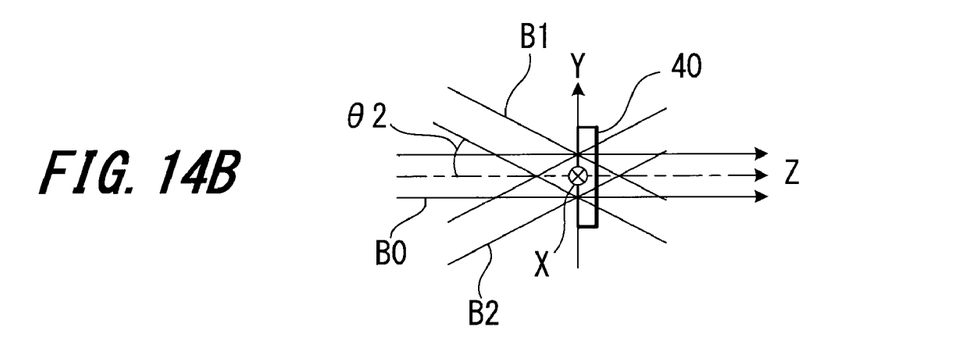
FIG. 14B is a view illustrating an angle of incidence of diffracted light.

An interference intensity distribution obtained in this optical system may be described by a general equation of multiple beam interference and may be represented by the following equation 2:

$$I=1+4\times\cos^2[k\cdot\sin\theta_2\cdot x+(\phi_\alpha-\phi_\beta y2]+4\times\cos^2[k\cdot\sin\theta_2\cdot y+(\phi_\chi-\phi_\delta)/2]+8\times\cos[\{(\phi_\alpha+\phi_\beta)-(\phi_\chi+\phi_\delta)\}/2]\times\cos[k\cdot\sin\theta_2\cdot x+(\phi_\alpha-\phi_\beta)/2]\times\cos[k\cdot\sin\theta_2\cdot y+(\phi_\chi-\phi_\delta)/2]+4\times\cos[k\cdot(-1+\cos\theta_2)\cdot z+(2\times\phi_\epsilon-(\phi_\alpha+\phi_\beta)/2]\times\cos[k\cdot\sin\theta_2\cdot x+(\phi_\alpha-\phi_\beta)/2]-4\times\cos[k\cdot(-1+\cos\theta_2)\cdot z+(2\times\phi_\epsilon-(\phi_\chi+\phi_\delta)/2]\times\cos[k\cdot\sin\theta_2\cdot y+(\phi_\chi-\phi_\delta)/2]$$ (2)

where κ is a wave number (κ=2π/λ, λ: wavelength), $\theta_2$ is a value half of an angle at which beams B1 and B2 of first-order diffracted light intersect with each other as shown in FIG. 14B, and $\phi\alpha$, $\phi\beta$, $\phi\chi$, $\phi\delta$, and $\phi\epsilon$ represent a phase state of each beam on a surface of the capacitor lens 24. A beam of first-order diffracted light is also incident on an X-Z plane at an angle of φ, although omitted from FIG. 14B. A three-dimensional structure may be formed on a material, where an amorphous region and a strain region are partially formed or a strain region is partially formed, for example, by performing interference exposure with plus and minus first-order diffracted light and a suitable amount of a zeroth-order light component in this manner.

An ultrashort pulse laser used in the above-described interference exposure has a pulse width of 100 femtoseconds in the example shown in FIG. 6 or 340 femtoseconds in the examples shown in FIGS. 8 and 12. When a pulse width is 10 picoseconds or smaller, peak power may be increased at the same energy and a multiphoton absorption process such as a two-photon absorption process may be induced. When a pulse width is smaller than 1 femtosecond, a pulse laser apparatus has a more complicated configuration, and a cost may be increased under existing circumstances. Therefore, an ultrashort pulse laser used in an embodiment of the present invention preferably has a pulse width of 1 femtosecond to 10 picoseconds.

In contrast, when a material has a high refractive index of, for example, 2, pulse laser light may not reach an inside of the material. In particular, pulse laser light may not be focused in the inside of the material by interference exposure, and thus a surface of the material is processed. In this case, since plasma is generated on the surface to absorb energy, pulse laser light may not easily be absorbed in the inside.

In contrast, when a pulse width is relatively larger, plasma may not easily be generated on the surface of the material and laser light easily reaches the inside.

Accordingly, when a modified region is formed by directly irradiating an inside of a material having a refractive index of more than 2 with an ultrashort pulse laser, the laser preferably has a pulse width of preferably 250 femtoseconds to 10 picoseconds. This is because that laser light having a pulse width of smaller than 250 femtoseconds is difficult to reach an inside of a material having a refractive index of 2 or more.

When a periodic structure is formed on a material by interference exposure, a period in the periodic structure depends not only on a wavelength but also on an angle formed by beams interfering with each other. Accordingly, when the material is particularly a light-emitting element, and a periodic refractive index structure in which a refractive index is periodically modulated is formed near a light-emitting region of the light-emitting element, for example, the structure may be formed not only in a case where the structure is smaller than a central wavelength of the light-emitting element but also in a case where the structure is larger than a central wavelength of the light-emitting element. As a result, a periodic structure may be formed with any period near a light-emitting region of a light-emitting element, and the periodic structure may perform various predetermined functions. When a periodic structure is formed with a smaller period, an embodiment of the present invention may be used for entrapping light. In addition, when a periodic structure is formed with a larger period, an embodiment of the present invention may be used for controlling a course of randomly oriented light such as light emitted from a light-emitting diode within a certain range by a diffraction effect of the light.

In the aforementioned embodiment, four-beam or five-beam interference exposure is performed for a material. However, a method for surface modification according to an embodiment of the present invention may be performed not only by interference exposure but also by sweep irradiation with an ultrashort pulse laser. Such processing may be performed for any region on a material by collecting sweep irradiation to form a modified region. When sweep irradiation is performed, any region on a material may be irradiated with a pulse laser using a laser apparatus shown in FIG. 2 in which a diffractive element and a light selecting element are omitted and placing the material on a two-dimensional stage or three-dimensional stage.

An embodiment of the present invention may be used not only for forming a periodic structure in which a modified region is periodically formed, but also for forming another modified region. A modified region may be formed by one-shot pulse irradiation (sweeping or interference exposure). Alternatively, a structure including a modified region in a deeper region may be formed by multiple-shot irradiation. When a multiphoton absorption process is used in a method for surface modification according to an embodiment of the present invention, a modified region may be formed at any depth. When interference exposure is used, a periodic structure of a modified region may be realized at any depth. This is because processing is performed without melting in the multiphoton absorption process, so that a processing depth per shot remains almost unchanged.

When a semiconductor material such as GaN is particularly used as a material, an irradiation energy is appropriately controlled, so that an irradiated portion may be partially (periodically in a case of interference exposure) modified with ablation processing or partially (periodically in a case of interference exposure) modified to form an amorphous region or a strain region at an energy equal to or lower than an ablation threshold, depending on the application of the material. Further, as described above, only an amorphous region may be formed by additionally performing the annealing step after the step of irradiation with a pulse laser. Alternatively, only a strain region may be formed by removing an amorphous region by polishing, etching, or the like.

As described above, according to an embodiment of the present invention, a material including a semiconductor material such as GaN is irradiated with ultrashort pulse laser light to modify a surface of the material, so that an amorphous region and a strain region may be formed, or only an amorphous region or a strain region may be formed. An irradiated portion may be partially, for example, periodically processed by ablation, or may be partially, for example, periodically modified to form an amorphous region or a strain region by appropriately controlling conditions of irradiation energy for exposure. Such processing does not have to be interference exposure in particular, but may also be collecting sweep irradiation of a material. Therefore, such processing may be performed in any portion to form a modified portion.

An embodiment of the present invention is not limited to the embodiment described above, and a laser apparatus for performing a method according to an embodiment of the present invention is also not limited to a laser apparatus shown in FIG. 2. Various transformations and modifications of an embodiment of the present invention are possible in terms of a material, conditions for irradiation with a pulse laser, and the like without departing from the scope of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method for surface modification comprising the steps of:
    emitting light from a pulse laser light source;
    diffracting the light utilizing a diffractive element including a diffractive beam splitter to generate beams including two pairs of plus and minus first-order light and a zeroth-order light;
    converging the beams utilizing a collimator lens;
    removing the zeroth-order light from the beams to include four beams;
    focusing the four beams on a material utilizing a capacitor lens at a point where the plus and minus first-order light of the two pairs intersect; and
    irradiating a material with the four beams of ultrashort pulse laser light to form a modified region including an amorphous region or a strain region on a surface of the material utilizing interference exposure.

2. A method for surface modification according to claim 1, wherein
    the ultrashort pulse laser light has a pulse width of 1 femtosecond to 10 picoseconds.

3. A method for surface modification according to claim 1, wherein the pairs of beams are parallel to each other when interference exposure is performed.

4. A method for surface modification according to claim 1, wherein
    the pulse laser light source has a pulse width of 250 femtoseconds to 10 picoseconds in response to a refractive index of the material being greater than 2.

5. A method for surface modification according to claim 1, further comprising the step of:
    annealing the material to relax at least a strain in the strain region after the step of irradiating the material with the ultrashort pulse laser light.

6. A method for surface modification according to claim 1, wherein
    the ultrashort pulse laser light has energy equal to or lower than an ablation threshold of the material.

7. A method for surface modification according to claim 6, further comprising the step of:
    forming a refractive index distribution structure including the amorphous region or the strain region on a portion of the material as a semiconductor material.

8. A method for surface modification according to claim 1, wherein
    the ultrashort pulse laser light has a wavelength in a range in which a two-photon absorption process or one-photon absorption process may occur corresponding to an absorption edge of the material.

9. A method for surface modification according to claim 1, wherein the material is a GaN substrate, wherein the light is a wavelength of 400 nm, and a highest output pulse energy is 350µJ.

10. A method for surface modification according to claim 1, wherein the amorphous region is formed under an ablation portion, the strain region is also formed under the amorphous region.

11. A method for surface modification according to claim 1, wherein both the strain region and the amorphous region are formed and the amorphous region is removed by chemical etching or physical etching.

12. A method for surface modification according to claim 1, wherein the wherein a focal length of the collimator lens and a distance between the collimator lens and the diffractive element is equal.

13. A method for surface modification according to claim 1, wherein the modified region is a three-dimensional periodic structure formed by interference exposure with the ultrashort pulse laser light including five beams, the five beams including plus and minus first-order light with a beam of zeroth-order light.

14. A method for surface modification comprising the steps of:

emitting light from a pulse laser light source;

diffracting the light utilizing a diffractive element including a diffractive beam splitter to generate beams including two pairs of plus and minus first-order light and a zeroth-order light;

converging the beams utilizing a collimator lens;

focusing the beams on a material utilizing a capacitor lens at a point where the plus and minus first-order light of the two pairs intersect;

irradiating a semiconductor material with ultrashort pulse laser light of the beams to form a three-dimensional structure of a modified region, the modified region including 1) an amorphous region, 2) a strain region, 3) or the amorphous region and the strain region within the semiconductor material.

15. The method for surface modification of claim 14, wherein the semiconductor material is a GaN substrate, wherein the surface modification is performed utilizing interference exposure.

16. The method for surface modification of claim 14, wherein the irradiating is performed using sweep irradiation by placing the substrate material on a two-dimensional stage or a three-dimensional stage.

17. The method for surface modification of claim 15, wherein the modified region is formed utilizing one-shot pulse irradiation.

18. The method for surface modification of claim 15, wherein the amorphous region is formed under an ablation portion, the strain region is also formed under the amorphous region.

* * * * *